United States Patent [19]
Reyhani

[11] Patent Number: 5,633,636
[45] Date of Patent: May 27, 1997

[54] HALF-GRAY DIGITAL ENCODING METHOD AND CIRCUITRY

[75] Inventor: Hooman Reyhani, Bishopstown, Ireland

[73] Assignee: Analog Devices, Inc., Norwood, Mass.

[21] Appl. No.: 537,995

[22] Filed: Oct. 2, 1995

[51] Int. Cl.$^6$ .................................................. H03M 7/16
[52] U.S. Cl. ............................................. 341/97; 341/155
[58] Field of Search .................................. 341/96, 97, 98, 341/159, 155

[56] References Cited

U.S. PATENT DOCUMENTS

| | | | |
|---|---|---|---|
| 4,445,110 | 4/1984 | Breslow | 341/10 |
| 4,963,874 | 10/1990 | Matsuzawa et al. | 341/159 |
| 4,975,698 | 12/1990 | Kagey | 341/96 |

FOREIGN PATENT DOCUMENTS 62-32724  2/1987  Japan.

OTHER PUBLICATIONS

Akazawa et al., "A 400MSOS 8b Flash AD Conversion LSI", *ISSCC 87*, Session IX: High-Speed ADCs, Feb. 25, 1987, pp. 98 and 375.

*Primary Examiner*—Brian K. Young
*Attorney, Agent, or Firm*—Koppel & Jacobs

[57] ABSTRACT

A Half-Gray digital encoding technique is disclosed for use in a parallel analog-to-digital converter (ADC) that reduces the ADC's output errors. A thermometer code, proportional to the ADC's analog input, is provided to a decoder which produces $2^n$ output lines with one active line for each binary 0-to-1 transition in the thermometer code. A 1-of-($2^n$)-to-Half-Gray encoder converts the decoder output to a Half-gray code which has error reducing properties. The Half-Gray code is then provided to an n-bit Half-Gray-to-binary decoder for converting the Half-Gray code to a standard Binary code ADC output.

15 Claims, 9 Drawing Sheets

|  | MSB | | | | | LSB |  | MSB | | | | | LSB |
|  | B6 | B5 | B4 | B3 | B2 | B1 |  | HG6 | HG5 | HG4 | HG3 | HG2 | HG1 |
| A'63 = | 1 | 1 | 1 | 1 | 1 | 1 | A63 = | 1 | 0 | 0 | 1 | 0 | 0 |
| A'62 = | 1 | 1 | 1 | 1 | 1 | 0 | A62 = | 1 | 0 | 0 | 1 | 0 | 1 |
| A'61 = | 1 | 1 | 1 | 1 | 0 | 1 | A61 = | 1 | 0 | 0 | 1 | 1 | 1 |
| A'60 = | 1 | 1 | 1 | 1 | 0 | 0 | A60 = | 1 | 0 | 0 | 1 | 1 | 0 |
| A'59 = | 1 | 1 | 1 | 0 | 1 | 1 | A59 = | 1 | 0 | 0 | 0 | 1 | 0 |
| A'58 = | 1 | 1 | 1 | 0 | 1 | 0 | A58 = | 1 | 0 | 0 | 0 | 1 | 1 |
| A'57 = | 1 | 1 | 1 | 0 | 0 | 1 | A57 = | 1 | 0 | 0 | 0 | 0 | 1 |
| A'56 = | 1 | 1 | 1 | 0 | 0 | 0 | A56 = | 1 | 0 | 0 | 0 | 0 | 0 |
| A'55 = | 1 | 1 | 0 | 1 | 1 | 1 | A55 = | 1 | 0 | 1 | 1 | 0 | 0 |
| A'54 = | 1 | 1 | 0 | 1 | 1 | 0 | A54 = | 1 | 0 | 1 | 1 | 0 | 1 |
| A'53 = | 1 | 1 | 0 | 1 | 0 | 1 | A53 = | 1 | 0 | 1 | 1 | 1 | 1 |
| A'52 = | 1 | 1 | 0 | 1 | 0 | 0 | A52 = | 1 | 0 | 1 | 1 | 1 | 0 |
| A'51 = | 1 | 1 | 0 | 0 | 1 | 1 | A51 = | 1 | 0 | 1 | 0 | 1 | 0 |
| A'50 = | 1 | 1 | 0 | 0 | 1 | 0 | A50 = | 1 | 0 | 1 | 0 | 1 | 1 |
| A'49 = | 1 | 1 | 0 | 0 | 0 | 1 | A49 = | 1 | 0 | 1 | 0 | 0 | 1 |
| A'48 = | 1 | 1 | 0 | 0 | 0 | 0 | A48 = | 1 | 0 | 1 | 0 | 0 | 0 |
| A'47 = | 1 | 0 | 1 | 1 | 1 | 1 | A47 = | 1 | 1 | 1 | 1 | 0 | 0 |
| A'46 = | 1 | 0 | 1 | 1 | 1 | 0 | A46 = | 1 | 1 | 1 | 1 | 0 | 1 |
| A'45 = | 1 | 0 | 1 | 1 | 0 | 1 | A45 = | 1 | 1 | 1 | 1 | 1 | 1 |
| A'44 = | 1 | 0 | 1 | 1 | 0 | 0 | A44 = | 1 | 1 | 1 | 1 | 1 | 0 |
| A'43 = | 1 | 0 | 1 | 0 | 1 | 1 | A43 = | 1 | 1 | 1 | 0 | 1 | 0 |
| A'42 = | 1 | 0 | 1 | 0 | 1 | 0 | A42 = | 1 | 1 | 1 | 0 | 1 | 1 |
| A'41 = | 1 | 0 | 1 | 0 | 0 | 1 | A41 = | 1 | 1 | 1 | 0 | 0 | 1 |
| A'40 = | 1 | 0 | 1 | 0 | 0 | 0 | A40 = | 1 | 1 | 1 | 0 | 0 | 0 |
| A'39 = | 1 | 0 | 0 | 1 | 1 | 1 | A39 = | 1 | 1 | 0 | 1 | 0 | 0 |
| A'38 = | 1 | 0 | 0 | 1 | 1 | 0 | A38 = | 1 | 1 | 0 | 1 | 0 | 1 |
| A'37 = | 1 | 0 | 0 | 1 | 0 | 1 | A37 = | 1 | 1 | 0 | 1 | 1 | 1 |
| A'36 = | 1 | 0 | 0 | 1 | 0 | 0 | A36 = | 1 | 1 | 0 | 1 | 1 | 0 |
| A'35 = | 1 | 0 | 0 | 0 | 1 | 1 | A35 = | 1 | 1 | 0 | 0 | 1 | 0 |
| A'34 = | 1 | 0 | 0 | 0 | 1 | 0 | A34 = | 1 | 1 | 0 | 0 | 1 | 1 |
| A'33 = | 1 | 0 | 0 | 0 | 0 | 1 | A33 = | 1 | 1 | 0 | 0 | 0 | 1 |
| A'32 = | 1 | 0 | 0 | 0 | 0 | 0 | A32 = | 1 | 1 | 0 | 0 | 0 | 0 |

|  | MSB | | | | | LSB |
|---|---|---|---|---|---|---|
|  | B6 | B5 | B4 | B3 | B2 | B1 |
| A'31 = | 0 | 1 | 1 | 1 | 1 | 1 |
| A'30 = | 0 | 1 | 1 | 1 | 1 | 0 |
| A'29 = | 0 | 1 | 1 | 1 | 0 | 1 |
| A'28 = | 0 | 1 | 1 | 1 | 0 | 0 |
| A'27 = | 0 | 1 | 1 | 0 | 1 | 1 |
| A'26 = | 0 | 1 | 1 | 0 | 1 | 0 |
| A'25 = | 0 | 1 | 1 | 0 | 0 | 1 |
| A'24 = | 0 | 1 | 1 | 0 | 0 | 0 |
| A'23 = | 0 | 1 | 0 | 1 | 1 | 1 |
| A'22 = | 0 | 1 | 0 | 1 | 1 | 0 |
| A'21 = | 0 | 1 | 0 | 1 | 0 | 1 |
| A'20 = | 0 | 1 | 0 | 1 | 0 | 0 |
| A'19 = | 0 | 1 | 0 | 0 | 1 | 1 |
| A'18 = | 0 | 1 | 0 | 0 | 1 | 0 |
| A'17 = | 0 | 1 | 0 | 0 | 0 | 1 |
| A'16 = | 0 | 1 | 0 | 0 | 0 | 0 |
| A'15 = | 0 | 0 | 1 | 1 | 1 | 1 |
| A'14 = | 0 | 0 | 1 | 1 | 1 | 0 |
| A'13 = | 0 | 0 | 1 | 1 | 0 | 1 |
| A'12 = | 0 | 0 | 1 | 1 | 0 | 0 |
| A'11 = | 0 | 0 | 1 | 0 | 1 | 1 |
| A'10 = | 0 | 0 | 1 | 0 | 1 | 0 |
| A'9 = | 0 | 0 | 1 | 0 | 0 | 1 |
| A'8 = | 0 | 0 | 1 | 0 | 0 | 0 |
| A'7 = | 0 | 0 | 0 | 1 | 1 | 1 |
| A'6 = | 0 | 0 | 0 | 1 | 1 | 0 |
| A'5 = | 0 | 0 | 0 | 1 | 0 | 1 |
| A'4 = | 0 | 0 | 0 | 1 | 0 | 0 |
| A'3 = | 0 | 0 | 0 | 0 | 1 | 1 |
| A'2 = | 0 | 0 | 0 | 0 | 1 | 0 |
| A'1 = | 0 | 0 | 0 | 0 | 0 | 1 |
| A'0 = | 0 | 0 | 0 | 0 | 0 | 0 |

FIG. 2b-1

|  | MSB | | | | | LSB |
|---|---|---|---|---|---|---|
|  | HG6 | HG5 | HG4 | HG3 | HG2 | HG1 |
| A31 = | 0 | 1 | 0 | 1 | 0 | 0 |
| A30 = | 0 | 1 | 0 | 1 | 0 | 1 |
| A29 = | 0 | 1 | 0 | 1 | 1 | 1 |
| A28 = | 0 | 1 | 0 | 1 | 1 | 0 |
| A27 = | 0 | 1 | 0 | 0 | 1 | 0 |
| A26 = | 0 | 1 | 0 | 0 | 1 | 1 |
| A25 = | 0 | 1 | 0 | 0 | 0 | 1 |
| A24 = | 0 | 1 | 0 | 0 | 0 | 0 |
| A23 = | 0 | 1 | 1 | 1 | 0 | 0 |
| A22 = | 0 | 1 | 1 | 1 | 0 | 1 |
| A21 = | 0 | 1 | 1 | 1 | 1 | 1 |
| A20 = | 0 | 1 | 1 | 1 | 1 | 0 |
| A19 = | 0 | 1 | 1 | 0 | 1 | 0 |
| A18 = | 0 | 1 | 1 | 0 | 1 | 1 |
| A17 = | 0 | 1 | 1 | 0 | 0 | 1 |
| A16 = | 0 | 1 | 1 | 0 | 0 | 0 |
| A15 = | 0 | 0 | 1 | 1 | 0 | 0 |
| A14 = | 0 | 0 | 1 | 1 | 0 | 1 |
| A13 = | 0 | 0 | 1 | 1 | 1 | 1 |
| A12 = | 0 | 0 | 1 | 1 | 1 | 0 |
| A11 = | 0 | 0 | 1 | 0 | 1 | 0 |
| A10 = | 0 | 0 | 1 | 0 | 1 | 1 |
| A9 = | 0 | 0 | 1 | 0 | 0 | 1 |
| A8 = | 0 | 0 | 1 | 0 | 0 | 0 |
| A7 = | 0 | 0 | 0 | 1 | 0 | 0 |
| A6 = | 0 | 0 | 0 | 1 | 0 | 1 |
| A5 = | 0 | 0 | 0 | 1 | 1 | 1 |
| A4 = | 0 | 0 | 0 | 1 | 1 | 0 |
| A3 = | 0 | 0 | 0 | 0 | 1 | 0 |
| A2 = | 0 | 0 | 0 | 0 | 1 | 1 |
| A1 = | 0 | 0 | 0 | 0 | 0 | 1 |
| A0 = | 0 | 0 | 0 | 0 | 0 | 0 |

FIG. 2b-2

Table 1

One Position Errors:

| Depth | Ideal Thermometer Code | Single | | | | | | | Multiple | | | | |
|---|---|---|---|---|---|---|---|---|---|---|---|---|---|
| | | A | B | C | D | E | F | G | H | I | J | K | L |
| +6 | 0 | 0 | 0 | 0 | 0 | 0 | 0 | 0 | 0 | 0 | 0 | 0 | 0 |
| +5 | 0 | 0 | 0 | 0 | 0 | 0 | 0 | 0 | 0 | 0 | 0 | 0 | 0 |
| +4 | 0 | 0 | 0 | 0 | 0 | 0 | 0 | 0 | 0 | 0 | 0 | 0 | 0 |
| +3 | 0 | 0 | 0 | 0 | 0 | 0 | 0 | 0 | 0 | 0 | 0 | 0 | 0 |
| +2 | 0 | 1 | 0 | 0 | 0 | 0 | 0 | 0 | 1 | 0 | 0 | 0 | 0 |
| +1 | 0 | 0 | 1 | 0 | 0 | 0 | 0 | 0 | 0 | 1 | 0 | 0 | 0 |
| 0 | 1 | 1 | 0 | 1 | 1 | 1 | 1 | 1 | 1 | 0 | 1 | 1 | 1 |
| -1 | 1 | 1 | 1 | 0 | 1 | 1 | 1 | 1 | 0 | 1 | 0 | 1 | 1 |
| -2 | 1 | 1 | 1 | 1 | 0 | 1 | 1 | 1 | 1 | 0 | 1 | 0 | 1 |
| -3 | 1 | 1 | 1 | 1 | 1 | 0 | 1 | 1 | 1 | 1 | 0 | 1 | 0 |
| -4 | 1 | 1 | 1 | 1 | 1 | 1 | 0 | 1 | 1 | 1 | 1 | 0 | 1 |
| -5 | 1 | 1 | 1 | 1 | 1 | 1 | 1 | 0 | 1 | 1 | 1 | 1 | 0 |
| -6 | 1 | 1 | 1 | 1 | 1 | 1 | 1 | 1 | 1 | 1 | 1 | 1 | 1 |

FIG. 4a

Table 2

Two Position Errors:

| Depth | Ideal Thermometer Code | A | B | C | D | E | F | G |
|---|---|---|---|---|---|---|---|---|
| +6 | 0 | 0 | 0 | 0 | 0 | 0 | 0 | 0 |
| +5 | 0 | 0 | 0 | 0 | 0 | 0 | 0 | 0 |
| +4 | 0 | 0 | 0 | 0 | 0 | 0 | 0 | 0 |
| +3 | 0 | 1 | 0 | 0 | 0 | 0 | 0 | 0 |
| +2 | 0 | 0 | 1 | 0 | 0 | 0 | 0 | 0 |
| +1 | 0 | 0 | 0 | 1 | 0 | 0 | 0 | 0 |
| 0 | 1 | 1 | 0 | 0 | 1 | 1 | 1 | 1 |
| -1 | 1 | 1 | 1 | 0 | 0 | 1 | 1 | 1 |
| -2 | 1 | 1 | 1 | 1 | 0 | 0 | 1 | 1 |
| -3 | 1 | 1 | 1 | 1 | 1 | 0 | 0 | 1 |
| -4 | 1 | 1 | 1 | 1 | 1 | 1 | 0 | 0 |
| -5 | 1 | 1 | 1 | 1 | 1 | 1 | 1 | 0 |
| -6 | 1 | 1 | 1 | 1 | 1 | 1 | 1 | 1 |

FIG. 4b

Table 3

Three Position Errors:

| Depth | Ideal Thermometer Code | A | B | C | D | E | F | G | H |
|---|---|---|---|---|---|---|---|---|---|
| +6 | 0 | 0 | 0 | 0 | 0 | 0 | 0 | 0 | 0 |
| +5 | 0 | 0 | 0 | 0 | 0 | 0 | 0 | 0 | 0 |
| +4 | 0 | 1 | 0 | 0 | 0 | 0 | 0 | 0 | 0 |
| +3 | 0 | 0 | 1 | 0 | 0 | 0 | 0 | 0 | 0 |
| +2 | 0 | 0 | 0 | 1 | 0 | 0 | 0 | 0 | 0 |
| +1 | 0 | 0 | 0 | 0 | 1 | 0 | 0 | 0 | 0 |
| 0 | 1 | 1 | 0 | 0 | 0 | 1 | 1 | 1 | 1 |
| -1 | 1 | 1 | 1 | 0 | 0 | 0 | 1 | 1 | 1 |
| -2 | 1 | 1 | 1 | 1 | 0 | 0 | 0 | 1 | 1 |
| -3 | 1 | 1 | 1 | 1 | 1 | 0 | 0 | 0 | 1 |
| -4 | 1 | 1 | 1 | 1 | 1 | 1 | 0 | 0 | 0 |
| -5 | 1 | 1 | 1 | 1 | 1 | 1 | 1 | 0 | 0 |
| -6 | 1 | 1 | 1 | 1 | 1 | 1 | 1 | 1 | 0 |
| -7 | 1 | 1 | 1 | 1 | 1 | 1 | 1 | 1 | 1 |

FIG. 4c

Table 4
(Maximum Position Error)

|  | | Binary | | Gray | | Quasi-Gray | | Half-Gray | |
|---|---|---|---|---|---|---|---|---|---|
|  | Error Depth | 3i | 4i | 3i | 4i | 3i | 4i | 3i | 4i |
| Single Position Error | +1 | 0 | 0 | 0 | 0 | 0 | 0 | 0 | 0 |
|  | 0 | 1 | 1 | 1 | 1 | 1 | 1 | 1 | 1 |
|  | -1 | 2 | 2 | 2 | 2 | 2 | 2 | 2 | 2 |
|  | -2 | 30 | 3 | 5 | 3 | 6 | 3 | 5 | 3 |
|  | -3 | 28 | 28 | 7 | 7 | 7 | 7 | 7 | 7 |
|  | -4 | 29 | 29 | 9 | 9 | 12 | 12 | 8 | 8 |
|  | -5 | 28 | 28 | 11 | 11 | 12 | 12 | 8 | 8 |
| Multiple Single Position Errors | -1,+1 | 2 | 2 | 2 | 2 | 2 | 2 | 2 | 2 |
|  | -2, 0 | 3 | 3 | 3 | 3 | 3 | 3 | 3 | 3 |
|  | -3,-1 | 4 | 4 | 4 | 4 | 4 | 4 | 4 | 4 |
|  | -4,-2 | 29 | 5 | 9 | 5 | 12 | 5 | 8 | 5 |
|  | -5,-3 | 28 | 28 | 11 | 11 | 12 | 12 | 8 | 8 |
| Two Position Errors | +1,+2 | 0 | 0 | 0 | 0 | 0 | 0 | 0 | 0 |
|  | 0,+1 | 1 | 1 | 1 | 1 | 1 | 1 | 1 | 1 |
|  | -1, 0 | 2 | 2 | 2 | 2 | 2 | 2 | 2 | 2 |
|  | -2,-1 | 3 | 3 | 3 | 3 | 3 | 3 | 3 | 3 |
|  | -3,-2 | 28 | 4 | 7 | 4 | 7 | 4 | 7 | 4 |
|  | -4,-3 | 29 | 29 | 9 | 9 | 12 | 12 | 8 | 8 |
|  | -5,-4 | 28 | 28 | 11 | 11 | 12 | 12 | 8 | 8 |
| Three Position Errors | +1,+2,+3 | 0 | 0 | 0 | 0 | 0 | 0 | 0 | 0 |
|  | 0,+1,+2 | 1 | 1 | 1 | 1 | 1 | 1 | 1 | 1 |
|  | -1, 0,+1 | 2 | 2 | 2 | 2 | 2 | 2 | 2 | 2 |
|  | -2,-1, 0 | 3 | 3 | 3 | 3 | 3 | 3 | 3 | 3 |
|  | -3,-2,-1 | 4 | 4 | 4 | 4 | 4 | 4 | 4 | 4 |
|  | -4,-3,-2 | 29 | 5 | 9 | 5 | 12 | 5 | 8 | 5 |
|  | -5,-4,-3 | 28 | 28 | 11 | 11 | 12 | 12 | 8 | 8 |
|  | -6,-5,-4 | 28 | 28 | 13 | 13 | 13 | 13 | 8 | 8 |

FIG. 5

Table 5
(Mean Position Error)

|  |  | Binary | | Gray | | Quasi-Gray | | Half-Gray | |
|---|---|---|---|---|---|---|---|---|---|
|  | Error Depth | 3i | 4i | 3i | 4i | 3i | 4i | 3i | 4i |
| Single Position Error | +1 | 0.0 | 0.0 | 0.0 | 0.0 | 0.0 | 0.0 | 0.0 | 0.0 |
|  | 0 | 1.0 | 1.0 | 1.0 | 1.0 | 1.0 | 1.0 | 1.0 | 1.0 |
|  | -1 | 2.0 | 2.0 | 2.0 | 2.0 | 2.0 | 2.0 | 2.0 | 2.0 |
|  | -2 | 4.3 | 3.0 | 1.8 | 3.0 | 1.8 | 3.0 | 2.0 | 3.0 |
|  | -3 | 4.5 | 4.5 | 2.3 | 2.3 | 2.9 | 2.9 | 2.3 | 2.3 |
|  | -4 | 5.8 | 5.8 | 2.8 | 2.8 | 3.2 | 3.2 | 2.5 | 2.5 |
|  | -5 | 6.1 | 6.1 | 3.4 | 3.4 | 3.6 | 3.6 | 2.8 | 2.8 |
| Multiple Single Position Errors | -1,+1 | 2.0 | 2.0 | 2.0 | 2.0 | 2.0 | 2.0 | 2.0 | 2.0 |
|  | -2, 0 | 3.0 | 3.0 | 3.0 | 3.0 | 3.0 | 3.0 | 3.0 | 3.0 |
|  | -3,-1 | 4.0 | 4.0 | 4.0 | 4.0 | 4.0 | 4.0 | 4.0 | 4.0 |
|  | -4,-2 | 5.8 | 5.0 | 2.8 | 5.0 | 3.2 | 5.0 | 2.5 | 5.0 |
|  | -5,-3 | 6.1 | 6.1 | 3.4 | 3.4 | 3.6 | 3.6 | 2.8 | 2.8 |
| Two Position Errors | +1,+2 | 0.0 | 0.0 | 0.0 | 0.0 | 0.0 | 0.0 | 0.0 | 0.0 |
|  | 0,+1 | 1.0 | 1.0 | 1.0 | 1.0 | 1.0 | 1.0 | 1.0 | 1.0 |
|  | -1, 0 | 2.0 | 2.0 | 2.0 | 2.0 | 2.0 | 2.0 | 2.0 | 2.0 |
|  | -2,-1 | 3.0 | 3.0 | 3.0 | 3.0 | 3.0 | 3.0 | 3.0 | 3.0 |
|  | -3,-2 | 4.5 | 4.0 | 2.3 | 4.0 | 2.9 | 4.0 | 2.3 | 4.0 |
|  | -4,-3 | 5.8 | 5.8 | 2.8 | 2.8 | 3.2 | 3.2 | 2.5 | 2.5 |
|  | -5,-4 | 6.1 | 6.1 | 3.4 | 3.4 | 3.6 | 3.6 | 2.8 | 2.8 |
| Three Position Errors | +1,+2,+3 | 0.0 | 0.0 | 0.0 | 0.0 | 0.0 | 0.0 | 0.0 | 0.0 |
|  | 0,+1,+2 | 1.0 | 1.0 | 1.0 | 1.0 | 1.0 | 1.0 | 1.0 | 1.0 |
|  | -1, 0,+1 | 2.0 | 2.0 | 2.0 | 2.0 | 2.0 | 2.0 | 2.0 | 2.0 |
|  | -2,-1, 0 | 3.0 | 3.0 | 3.0 | 3.0 | 3.0 | 3.0 | 3.0 | 3.0 |
|  | -3,-2,-1 | 4.0 | 4.0 | 4.0 | 4.0 | 4.0 | 4.0 | 4.0 | 4.0 |
|  | -4,-3,-2 | 5.8 | 5.0 | 2.8 | 5.0 | 3.2 | 5.0 | 2.5 | 5.0 |
|  | -5,-4,-3 | 6.1 | 6.1 | 3.4 | 3.4 | 3.6 | 3.6 | 2.8 | 2.8 |
|  | -6,-5,-4 | 6.4 | 6.4 | 3.9 | 3.9 | 4.6 | 4.6 | 3.0 | 3.0 |

FIG. 6

HALF-GRAY DIGITAL ENCODING METHOD AND CIRCUITRY

BACKGROUND OF THE INVENTION

1. Field of the Invention

The present invention relates to parallel analog-to-digital converters (ADCs) and more particularly to digital encoding techniques for reducing the output errors of an ADC.

2. Description of the Related Art

The objective of ADC circuits is to receive an analog signal and produce an error free digitized version of that analog signal. A well known ADC circuit is the parallel or flash ADC, which receives an analog signal to be digitized at an input node and compares its voltage to a set of reference voltages. For n bits of resolution in the ADC's digital output, a known voltage is applied to a ladder of $2^n$ series resistors to provide reference voltages at the nodes between the resistors. Comparators, typically implemented with high gain amplifiers, receive respective reference voltages at one input and the analog input signal at another input to produce either a low output (binary 0) if the comparator's reference voltage is greater than the analog input, or a high output (binary 1) if the analog input is higher than the comparator's reference voltage. Ideally, the resulting digital comparator outputs, referred to as a thermometer code, are a series of binary 0s for comparators which receive reference voltages greater than the analog input signal, and a series of binary is for comparators which receive a reference voltage less than the analog input signal. The transition from binary 0s to 1s indicates the amplitude of the analog input signal.

To generate a digital output, the thermometer code is first applied to a 1-of-$(2^n-1)$ decoder that generates a $2^n$ line output code with only one active output line, which corresponds to the binary 0-to-1 transition in the thermometer code. The decoder's active output selects and enables a single address in a 1-of-$2^n$-to-Binary encoder that has a set of encoded n-bit standard Binary codes for each address. The n-bit standard Binary code and the corresponding address are matched. For example, if n=4 the first address, A0, has a binary code 0000, the second address, A1, has a binary code 0001, and so on to the sixteenth address, A15, having a binary code 1111. The encoder address selected provides the standard Binary code output of the ADC which corresponds to the strength of the analog input signal. The encoder is typically implemented using read only memory (ROM).

A common problem with the parallel ADC is that, when it is operated at high analog input slew rates, irregular comparator outputs may be produced due to timing skews between adjacent comparators, the analog input signal and the comparators' strobe signal. Comparator output irregularities result in more than one binary 0-to-1 transition in the thermometer code. This in turn causes more than one decoder output to be activated, which in turn causes multiple encoder addresses to be selected. The encoder output is typically the logical OR or the logical AND of these addresses, producing an ADC output that is an inaccurate digitized version of the input.

Several digital encoding methods exist which reduce the errors resulting from the conversion of the thermometer code to an n-bit Binary ADC output. The encoding methods operate by passing the decoder output through an encoder which has a set of error reducing n-bit codes at each input address that compensate for the possibility of receiving multiple binary 0-to-1 transition points from the comparators. The error reducing encoder output is then decoded to a standard Binary code which is the ADC's error reduced output.

One well known error reducing encoding method is the Gray code, which provides only a one bit change in the encoder codes of adjacent addresses. For example, adjacent addresses A2 and A3 have corresponding codes of 0011 and 0010, respectively. As another example, adjacent addresses A7 and A8 have corresponding codes of 0100 and 1100, respectively. The logical OR of any two Gray codes from adjacent addresses is thus always equal to one of the codes, resulting in an error in the Grey code decoder output of at most one in $2^n$ parts (this is assuming that the error occurs at adjacent encoder input addresses). The n-bit Gray code encoder output is then converted into an n-bit standard Binary code through a decoder circuit to produce the ADC output. A problem with the Gray-to-Binary decoder circuit is that it takes several gate delays to convert the Gray code encoder output to standard Binary form, significantly slowing down the ADC's throughput rate. Also, the Gray code has limited error reduction capacity for errors that are not at adjacent encoder addresses.

Another encoding technique is the Quasi-Gray code, which is disclosed in Japanese Patent Application No. S60-171023, Kamoto et. al., Aug. 5, 1985. The Quasi-Gray code improves on the throughput rate of the Gray code by converting its encoder output to standard Binary code in only a single gate delay. The error reducing performance of the Quasi-Gray code, however, is limited for multiple binary 0-to-1 transition points separated by two or more encoder addresses. The modified Quasi-Gray digital encoding technique, disclosed in U.S. Pat. No. 4,975,698 to Kagey, Dec. 4, 1990, improves on the error correction performance of the Quasi-Gray code for simultaneous transition points separated by two or more encoder addresses. The modified Quasi-Gray code is the same as the Quasi-Gray code in all but the least significant bit position, which alternates in the same manner as the standard Binary code.

SUMMARY OF THE INVENTION

The present invention is a novel parallel ADC digital encoding circuit which reduces ADC output errors as compared to existing systems.

This is accomplished by converting the 1-of-$(2^n-1)$ decoder output, which has $2^n$ binary lines with one active line representing the amplitude of the ADC's analog input signal, into a novel n-bit "Half-Gray" code. The Half-Gray code is provided by a 1-of-2-to-"Half-Gray" code encoder, which has $2^n$ addresses, with each address having an associated n-bit "Half-Gray" word. The n-bit "Half-Gray" word for each encoder address is characterized by the following algorithm:

$$HG(i)=B(i) \text{ for } i=N \text{ and } i=N/2$$

$$HG(i)=B(i) XOR\ B(i+1) \text{ for } (N/2)<i<N \text{ and } 0<i<(N/2)$$

For this algorithm, HG is the n-bit "Half-Gray" word output of the 1-of-$2^n$-to-Half-Gray code encoder and B is the standard Binary word. N is the total number of bits in the "Half-Gray" word and can be any even integer greater than 2 (i.e. 4, 6, 8 . . . ). i is an individual bit and XOR is the exclusive-OR logic function.

The Half-Gray words compensate for errors in the decoded thermometer code. The encoder combines the Half-Gray words at each of its decoder activated addresses to produce a single n-bit Half-Gray output. This is performed by combining the respective bits at each encoder address by the logic OR function, or the logic AND function. A Half-Gray-to-Binary decoder converts the n-bit Half-Gray word encoder output into an n-bit standard Binary word, which is the output of the ADC. The following algorithm characterizes the conversion of a Half-Gray word to standard Binary code:

$B(i)=HG(i)$ for $i=N$ and $i=N/2$ $B(i)=HG(i)$ XOR $B(i+1)$ for $(N/2)<i<N$ and $0<i<(N/2)$ For this algorithm, B is the n-bit standard Binary Half-Gray-to-Binary decoder output, HG is an n-bit Half-Gray word and i is an individual bit. N is the total number of bits in the Half-Gray-to-Binary decoder output and can be any even integer greater than 2 (i.e. 4, 6, 8 . . . ). XOR is a symbol for the exclusive-OR logic function. B is calculated from the highest bit to the lowest bit, so that the binary value of $B(i+1)$ is established before calculating $B(i)$.

BRIEF DESCRIPTION OF THE DRAWINGS

FIG. 2a presents the upper portions of Table A, which is a 6-bit standard Binary code, and Table B, which is a 6-bit Half-Gray code, while FIG. 2b presents the lower portions of Tables A and B.

DETAILED DESCRIPTION OF THE INVENTION

Figure 1A:
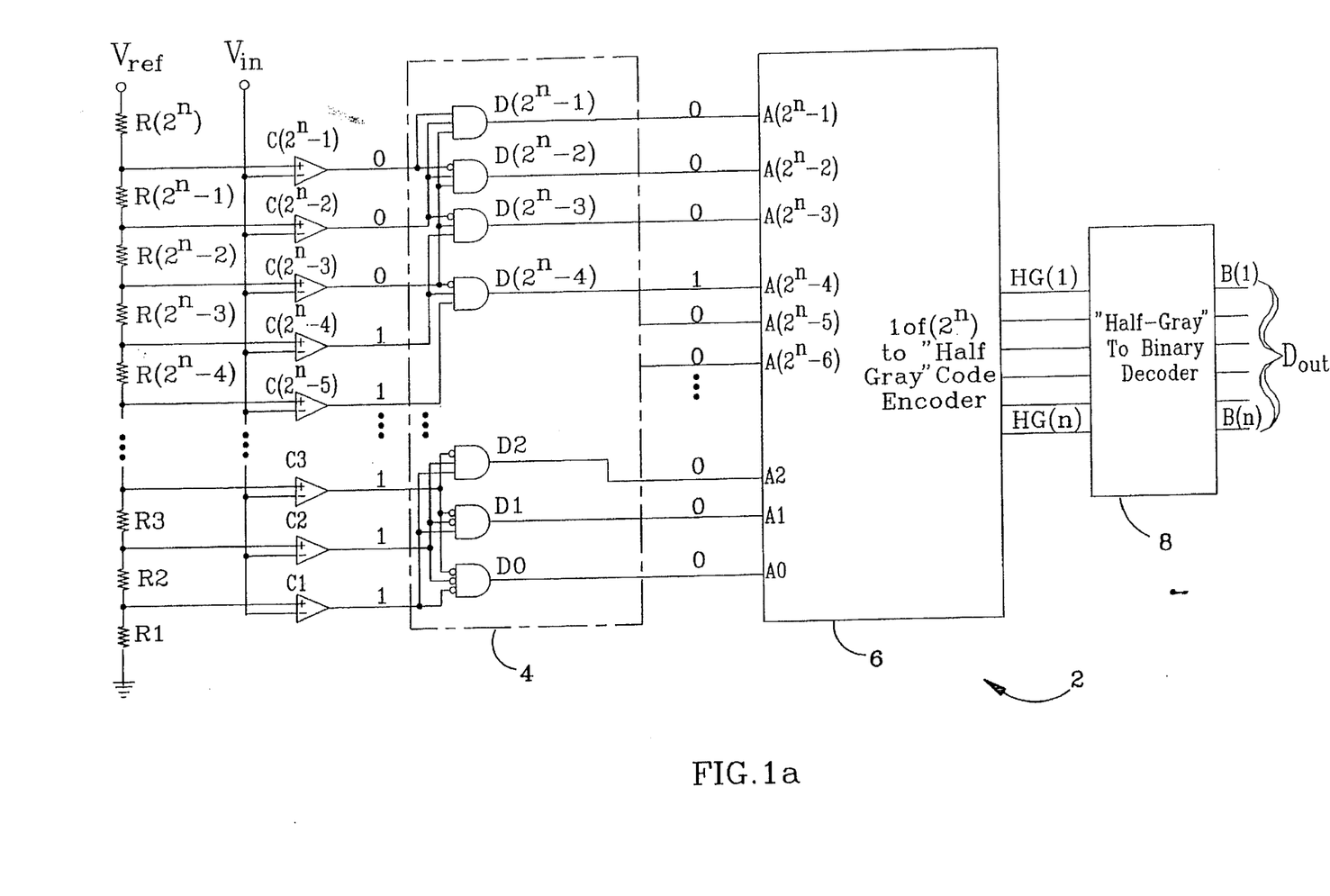
FIG. 1a is a schematic diagram of an ADC in accordance with the present invention.

Referring first to FIG. 1a, a parallel ADC 2 of the present invention receives an analog input voltage Vin and compares it simultaneously to a series of reference voltages to produce an n-bit digital output Dout which corresponds to Vin. For the purposes of this invention, n is an even integer greater than 2; as n is increased, the resolution of Dout is increased. A reference voltage Vref is applied to a ladder of $2^n$ resistors, $R1$-$R(2^n)$, that are connected in series to produce $(2^n-1)$ reference voltages at the nodes between the resistors. Each reference voltage is applied to the non-inverting input terminal of a respective comparator from an array of $(2^n-1)$ comparators, $C1$-$C(2^n-1)$. Vin is applied to the inverting terminal of the comparators for comparing Vin to each comparator's respective reference voltage. For example, the reference voltage at the node between $R(2^n)$ and $R(2^n-1)$ is applied to $C(2^n-1)$'s non-inverting input and Vin is applied to $C(2^n-1)$'s inverting input. Each comparator, typically implemented with a high gain amplifier, compares its reference voltage to Vin and provides a high voltage output (binary 1) if its reference voltage is lower than Vin, or a low voltage output (binary 0) if its reference voltage is higher than Vin. The comparator outputs from C1 to $C(2^n-1)$ are referred to as a thermometer code and ideally include a series of binary 0's for bits above the input voltage and a series of binary 1's for bits below the input voltage.

An example of a thermometer code is provided in FIG. 1a, with binary 0 outputs for $C(2^n-1)$, $C(2^n-2)$ and $C(2^n-3)$, followed by binary 1 outputs for $C(2^n-4)$ down to C1. This indicates that Vin is less than the node voltage between $R(2^n-2)$ and $R(2^n-3)$, but greater than the node voltage between $R(2^n-3)$ and $R(2^n-4)$. If n is increased, the number of resistors R1 to $R(2^n)$ also increases, providing smaller voltage increments between the reference voltages received by the comparators $C1$-$C(2^n-1)$. This increases the resolution of Dout.

The outputs of the comparators are provided to a 1-of-$(2^n-1)$ decoder 4, which produces a single active output line corresponding to the position of the binary 0-to-1 transition in the thermometer code. The decoder 4 in FIG. 1a is implemented using $2^n$ three input AND gates, $D0$-$D(2^n-1)$. $D(2^n-1)$ receives outputs from $C(2^n-1)$, $C(2^n-2)$ and $C(2^n-3)$ to provide a binary 1 output only if all of its inputs are binary 1. This corresponds to the situation where Vin is greater than the voltage at the node between $R(2^n)$ and $R(2^n-1)$. AND gates $D(2^n-2)$ down to D2 receive three consecutive comparator outputs starting with $C(2^n-1)$ for $D(2^n-2)$. Each successive one of these AND gates after $D(2^n-2)$ receives comparator outputs that start from one comparator output level lower than the highest comparator output level received by its prior AND gate. Thus, if $D(2^n-2)$ receives outputs from $C(2^n-1)$, $C(2^n-2)$ and $C(2^n-3)$, then $D(2^n-3)$ receives outputs from $C(2^n-2)$, $C(2^n-3)$ and $C(2^n-4)$, and so on, with $D(2)$ receiving outputs from C3, C2 and C1. $D(2^n-2)$ to D2 each have an inverter at their highest level input so that a binary 011 thermometer code input will produce a binary 1 output, indicating the binary 0-to-1 transition of the thermometer code has occurred between their two highest level inputs. As an example, the inputs to $D(2^n-2)$ are the inverted output of $C(2^n-1)$ and the non-inverted outputs of $C(2^n-2)$ and $C(2^n-3)$, which result in a binary 101 input to $D(2^n-2)$ when the input analog signal is between $R(2^n-1)/R(2^n-2)$ and $R(2^n-2)/R(2^n-3)$ levels. $D(2^n-2)$'s output is thus binary 0. The inputs to $D(2^n-4)$ on the other hand, are the inverted output of $C(2^n-3)$ and the non-inverted outputs of $C(2^n-4)$ and $C(2^n-5)$, which result in a binary 111 input to $D(2^n-4)$ for the same analog input voltage; this produces a binary 1 output for $D(2^n-4)$. $D(2^n-4)$, thus corresponds to the binary 0-to-1 transition point for the thermometer code.

AND gate D1 receives the inverted outputs of C3 and C2 and the non-inverted output of C1 to produce a binary 1 output when the outputs of the last three comparators are binary 001. All of the inputs to AND gate D0, from C3, C2 and C1 are inverted to produce a binary 1 output when the outputs of the last three comparators are binary 000.

Although $D0$-$D(2^n-1)$ are implemented using three input AND gates, two input or four input AND gates could also be used.

FIG. 1a shows the ideal decoder 4 output which includes only one active line (indicated by a binary 1). In practice, however, when the ADC 2 is operated at high analog input slew rates, irregular comparator outputs may be produced due to timing skews between adjacent comparators, Vin and the comparators' strobe signal. Irregular comparator outputs result in more than one binary 0-to-1 transition in the thermometer code. This in turn causes more than one decoder 4 output to be activated, which results in an errant Dout.

The circuitry of the ADC 2 described up to this point, which includes resistors $R1$-$R(2^n)$, comparators $C1$-$C(2^n-1)$ and the circuitry of the decoder 4, is conventional. The novel aspect of the present invention lies in the circuitry designed to limit the potential errors in Dout due to decoder 4 output errors. This circuitry includes a 1-of-($2^n$) to-"Half-Gray" code encoder 6 that converts the decoder 4 outputs D0-D ($2^n$-1), received at addresses A0-A($2^n$-1), respectively, into an n-bit Half-Gray word, HG(1) to HG(n). A "Half-Gray"-to-Binary decoder 8 receives lines HG(1) to HG(n) and converts them to an n-bit standard Binary output, B(1) to B(n), which is Dout.

The Half-Gray encoder 6 has $2^n$ address inputs, A0-A($2^n$-1), each of which has a corresponding encoded n-bit Half-Gray word. An active decoder 4 output line activates the encoder address input to which it is connected. The encoder 6 in turn provides the encoded "Half-Gray" word at its activated address as an n-bit output, HG(n)-HG(1). The encoder 6 is implemented using Read Only Memory (ROM) technology, with A0-A($2^n$-1) being the ROM address inputs and HG(n)-HG(1) being the ROM data outputs.

If more than one decoder 4 output is active as in the case of a thermometer code error, then the encoded Half-Gray words at the encoder's activated addresses are combined by their corresponding bits to form a single n-bit Half-Gray word encoder 6 output, HG(n)-HG(1). This is performed according to either the OR function or the AND function.

Figure 1B:
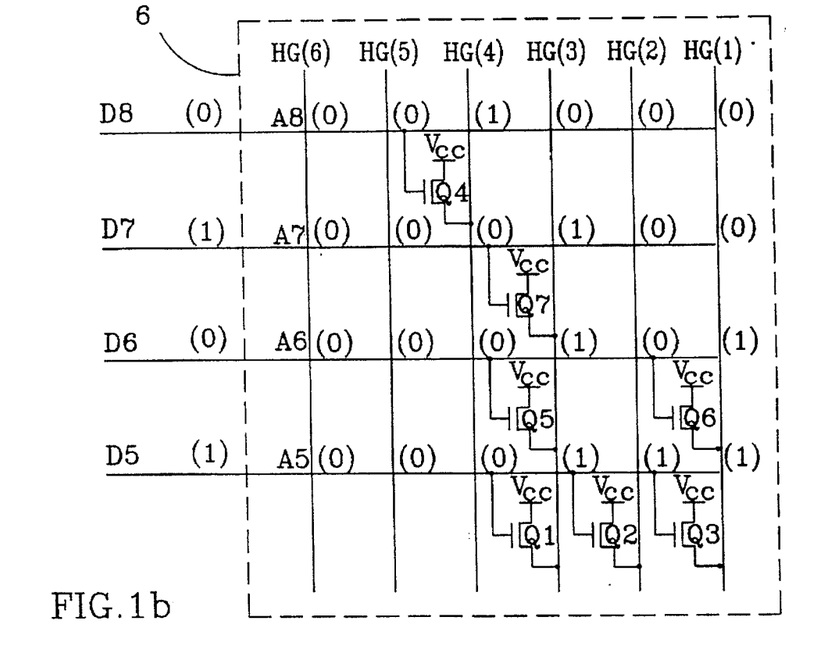
FIGS. 1b and 1c are schematic diagrams of Wired-OR and Wired-AND Half-Gray ROM encoders, respectively.

FIG. 1b shows a portion of the circuitry for a 6-bit Wired-OR ROM Half-Gray encoder 6, which combines multiple activated addresses by the OR function. The circuitry includes 6-bit input addresses A5-A8, which are encoded with Half-Gray codes, and the encoder outputs HG(6)-HG(1). The complete circuitry for a 6-bit ROM encoder has 64 addresses, A0-A63. In FIG. 1b, for each address bit that is encoded with a binary 1, a MOSFET transistor is connected by its gate terminal to the address input line, by its source to a power supply and by its drain to the encoder output for that bit. With this connection, an active input (binary 1) to a MOSFET's gate terminal will turn the MOSFET on, providing its source voltage to its drain. This sends a high voltage (binary 1) to the encoder output bit connected to that drain. There is no connection for a bit that is encoded a binary 0. Although the encoder of FIG. 1b is implemented with MOSFET transistors, bipolar transistors could also be used.

To illustrate the operation of the Wired-OR ROM encoder of FIG. 1b, address line A5 is shown encoded with Half-Grey code 000111 for output bits HG(6)-HG(1) (In FIG. 1b, the binary value for each bit is indicated on the address line in parenthesis). This is performed by connecting MOSFET Q1 by its gate to decoder output line D5 (which feeds into A5), by its source to power supply Vcc and by its drain to output line HG(3). MOSFETs Q2 and Q3 are similarly connected, except that their drains are connected to output lines HG(2) and HG(1), respectively. In operation, if D5/A5 is active, as indicated by a binary 1 next to D5/-A5, then the gates of Q1, Q2 and Q3 receive a high voltage line. This turns Q1, Q2 and Q3 on which provide their source voltages to their drains, producing high voltage signals (binary 1s) at output bits HG(3), HG(2) and HG(1), respectively. There are no connections between D5/A5 and HG(6), HG(5), and HG(4) since they are encoded binary 0; thus, these output bits receive a binary 0. As another example, address line A8 is encoded with Half-Gray code 001000 for HG(6)-HG(1) by connecting MOSFET Q4's gate to decoder output line D8/encoder input address A5, by its source to power supply Vcc and by its drain to output line HG(4). There are no connections between D8 and HG(6), HG(5), HG(3), HG(2) and HG(1) since they are encoded binary 0. Through similar connections for MOSFETs Q5, Q6 and Q7, addresses A6 and A7 are encoded with binary 000101 and 000-100, respectively.

If more than one decoder output is activated, which may occur due to a thermometer code error, then multiple addresses will be activated. The encoder of FIG. 1b combines the corresponding output bits of these addresses by the OR function. Thus, a single binary 1 address output bit will override any binary 0 produced by another address at that output bit to provide a combined output of binary 1. For example, if address lines A5 and A7 are activated as indicated by binary 1's at D5 and D7, then A5 will send a binary 1 to addresses HG(3)-HG(1) and A7 will send a binary 1 to HG(3). At output bits HG(6)-HG(4), both addresses have no connections and thus provide a binary 0. At output bits HG(3)-HG(1), at least one of the two addresses provides a binary 1, resulting in a binary 1 at HG(3)HG (1).

Figure 1C:
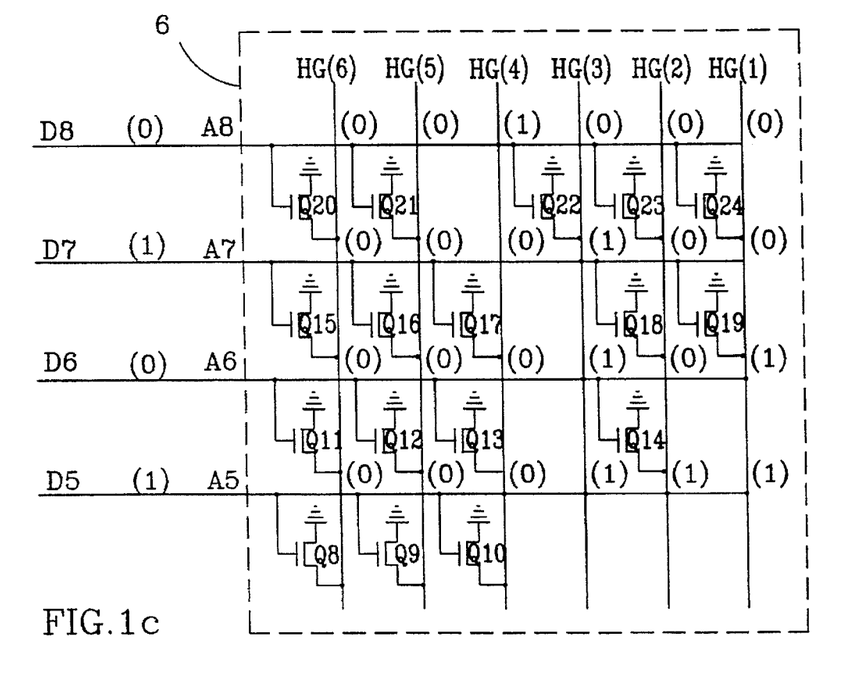

FIG. 1c shows a portion of the circuitry for a 6-bit Wired-AND ROM Half-Gray encoder 6, which combines multiple activated addresses by the function. The circuitry includes 6-bit input addresses A5-A8 encoded with Half-Gray codes, and the encoder outputs HG(6)-HG(1). The complete circuitry for a 6-bit ROM encoder has 64 addresses, A0-A63. In FIG. 1c, for each address bit that is encoded with a binary 0, a MOSFET transistors is connected by its gate terminal to the decoder output line, by its drain to ground and by its source to the encoder output for that bit. With this connection, an active input (binary 1) to a MOSFET's gate terminal will turn the MOSFET on, grounding its source to its drain. This in turn grounds the encoder output bit connected to that source terminal, resulting in a binary 0 at that output bit. An address bit that is encoded with binary 1 is directly connected to its corresponding output bit to send an active (binary 1) address input to the output bit.

To illustrate the Wired-AND ROM's operation, address line A5 is encoded with Half-Gray code 000111 for HG(6) HG(1) by connecting MOSFET Q8 by its gate to decoder output line D5, by its drain to ground and by its source to output line HG(6). MOSFETs Q9 and Q10 are similarly connected, except that their sources are connected to output lines HG(5) and HG(4), respectively. In operation, if D5 is active the gates of Q8, Q9 and Q10 receive a high voltage line. This turns Q8, Q9 and Q10 on, which then act like switches, grounding their sources. This provides a binary 0 to HG(6), HG(5) and HG(4). HG(3), HG(2), and HG(1) receive the binary 1 from D5 directly. Through similar connections for MOSFETs Q11–Q24, addresses A6, A7 and A8 are encoded with binary 000101, 000100 and 001000, respectively.

If more than one decoder output is activated due to a thermometer code error, then multiple activated addresses are combined according to the AND function. This is achieved because a MOSFET that produces binary 0 at an address bit grounds any binary 1 produced by another address at the same bit. A binary 1 output bit will result only if all of the activated addresses produce a binary 1 at that bit. To illustrate, if address lines A5 and A7 are activated, as indicated by a binary 1 at D5 and D7, then both Q8 and Q15 ground HG(6), producing a binary 0 at HG(6). Similarly, Q9 and Q16 ground HG(5) and Q10 and Q17 ground HG(4), producing a binary 0 at those output bits. Since A5 and A7 are directly connected to HG(3), a binary 1 is produced at HG(3). Q18 grounds HG(2) while A5 provides a binary 1 at HG(2). This binary 1 is grounded by Q18, producing a binary 0 at HG(2). Similarly, Q19 grounds HG(1), producing a binary 0 at HG(1). The resulting output HG(6)HG(1) is binary 000100, which is the AND combination of the corresponding bits of A5 and A7.

Figure 2A:
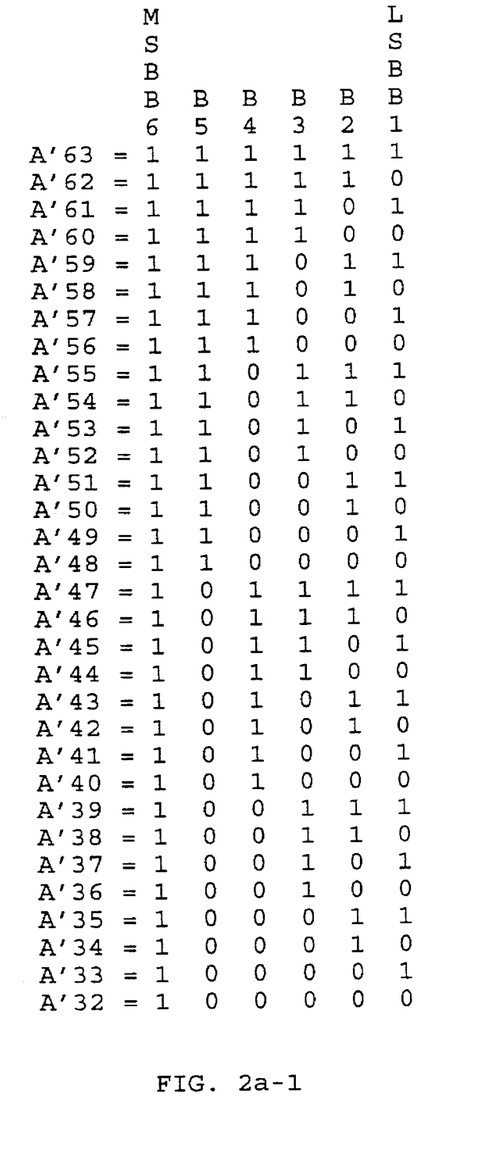
Figure 2A:
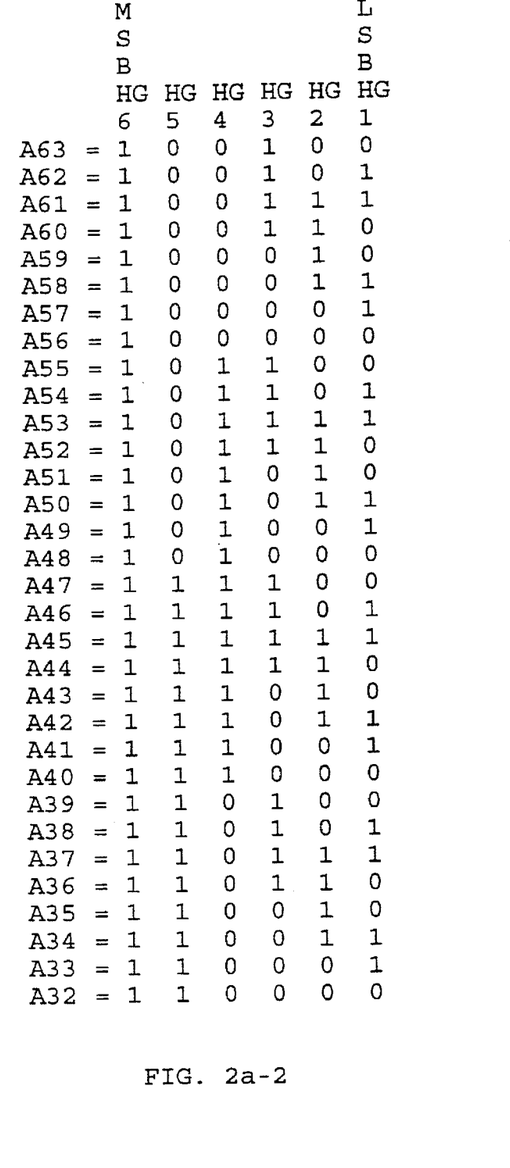
Figure 2B:
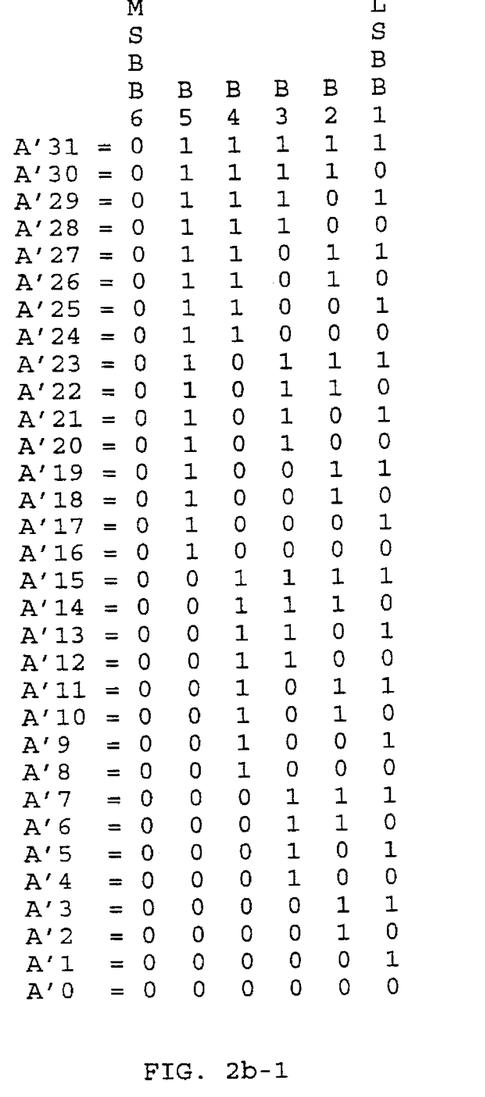
Figure 2B:
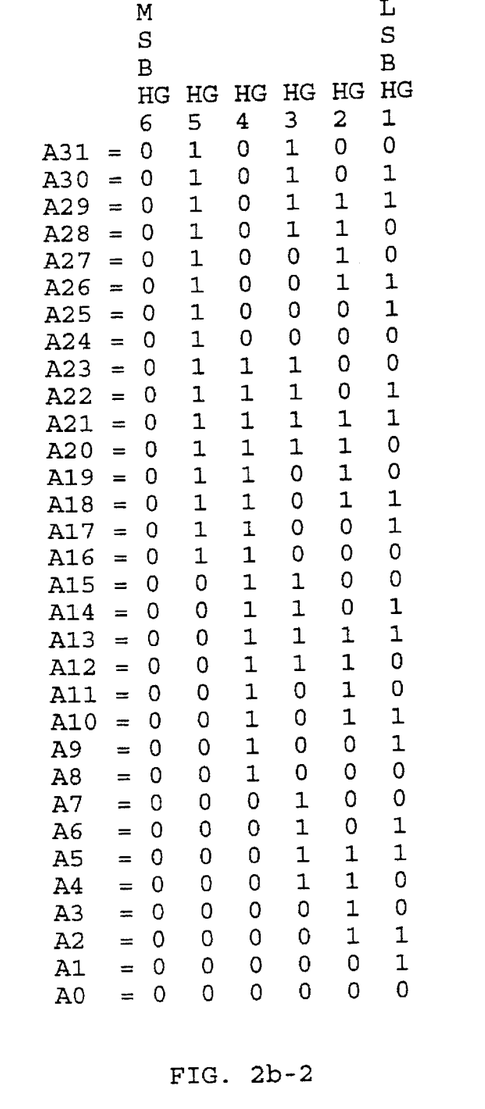

FIGS. 2a and 2b compare a standard Binary code in Table A with the corresponding "Half-Gray" code in Table B, for the example of a 6-bit word. Table A includes address lines A'0–A'63 increasing vertically upward from A'0 to A'63. Horizontally across each address is a 6-bit standard Binary code, B(6)-B(1), associated with that address. B(6) is the most significant bit (MSB) and B(1) is the least significant bit (LSB). Table B shows address lines A0–A63 for a 6-bit Half-Gray encoder increasing vertically upward from A0 to A63. Horizontally across each address is the 6-bit encoded Half-Gray word, HG(6)-HG(1), associated with each address.

Art algorithm for creating an n-bit Half-Gray word from an n-bit standard Binary word in accordance with the present invention is provided below.

$HG(i)=B(i)$ for $i=N$ and $i=N/2$ $HG(i)=B(i)$ XOR $B(i+1)$ for $(N/2)<i<N$ and $0<i<(N/2)$ For this algorithm, HG is the n-bit "Half-Gray" word output of the 1-of-$2^n$-to-Half-Gray code encoder and B is the standard Binary word. N is the total number of bits in the "Half-Gray" word and can be any even integer greater than 2 (i.e. 4, 6, 8 . . . ). i is an individual bit and is an integer. XOR is the exclusive-OR logic function.

To establish HG for a particular address, the corresponding address in the standard Binary code is accessed and applied to the above equations. For example, if the Half-Gray word for the address A30 is to be established, the address A'30 is accessed; this has the standard Binary code 011110 from B6 to B1. Since N=6 in this case, for i equal to 6 and 3, HG(i)=B(i). For $3<i<6$ (i=4 and i=5) and for $0<i<3$ (i=1 and i=2), HG(i)=B(i) XOR B(i+1). Accordingly, HG(6)=B(6)=0; HG(5)=B(5) XOR B(6)=1 XOR 0=1; HG(4)=B(4) XOR B(5)=1 XOR 1=0; HG(3)=B(3)=1; HG(2)=B(2) XOR B(3)=1 XOR 1=0; and HG(1)=B(1) XOR B(2)=0 XOR 1=1. The Half-Gray word, HG(6)-HG(1), for address A30 is thus 010101 as indicated in Table B.

The Half-Gray-to-Binary decoder 8 converts the n-bit Half-Gray code produced by the encoder 6 into an n-bit standard Binary code which is the ADC's digital output, B(1)-B(n). The following algorithm characterizes the conversion from "Half-Gray" to standard Binary.

$B(i)=HG(i)$ for $i=N$ and $i=N/2$ $B(i)=HG(i)$ XOR $B(i+1)$ for $(N/2)<i<N$ and $0<i<(N/2)$ For this algorithm, B is the n-bit Half-Gray-to-Binary decoder output and HG is the n-bit Half-Gray word produced by the encoder 6. N is the total number of bits in the Half-Gray-to-Binary decoder output and can be any even integer greater than 2 (i.e. 4, 6, 8 . . . ). i is an individual bit and is an integer. XOR is a symbol for the exclusive-OR logic function. B is calculated from the highest bit to the lowest bit, so that the binary value of B(i+1) is established before calculating B(i).

To calculate B, HG is applied to the above equations. For example, if N=6, the encoder 6 produces 010101 from HG(6)-HG(1) when address A30 is accessed by the decoder. Since N=6 in this case, for i equal to 6 and 3, B(i)=HG(i). For $3<i<6$ (i=4 and i=5) and for $0<i<3$ (i=1 and i=2), B(i)=HG(i) XOR B(i+1). Applying HG(6)-HG(1) of A30 to the above equations, B(6) is first established by B(6)=HG(6)=0; B(5) is then established by B(5)=HG(5) XOR B(6)=1 XOR 0=1. It can be seen that to determine B(5), it is necessary to first calculate B(6). B(4) is then calculated by B(4)=HG(4) XOR B(5)=0 XOR 1=1. It is necessary to determine the bit higher than B(4), which is B(5), before calculating B(4). B(3) is independently established by B(3)=HG(3)=1; B(2) and B(1) are calculated in a manner similar to calculating B(5) and B(4). Thus, B(2)=HG(2) XOR B(3)=0 XOR 1=1, and B(1)=HG(1) XOR B(2)=1 XOR 1=0. B(6)-B(1) is therefore binary 011110.

Figure 3:
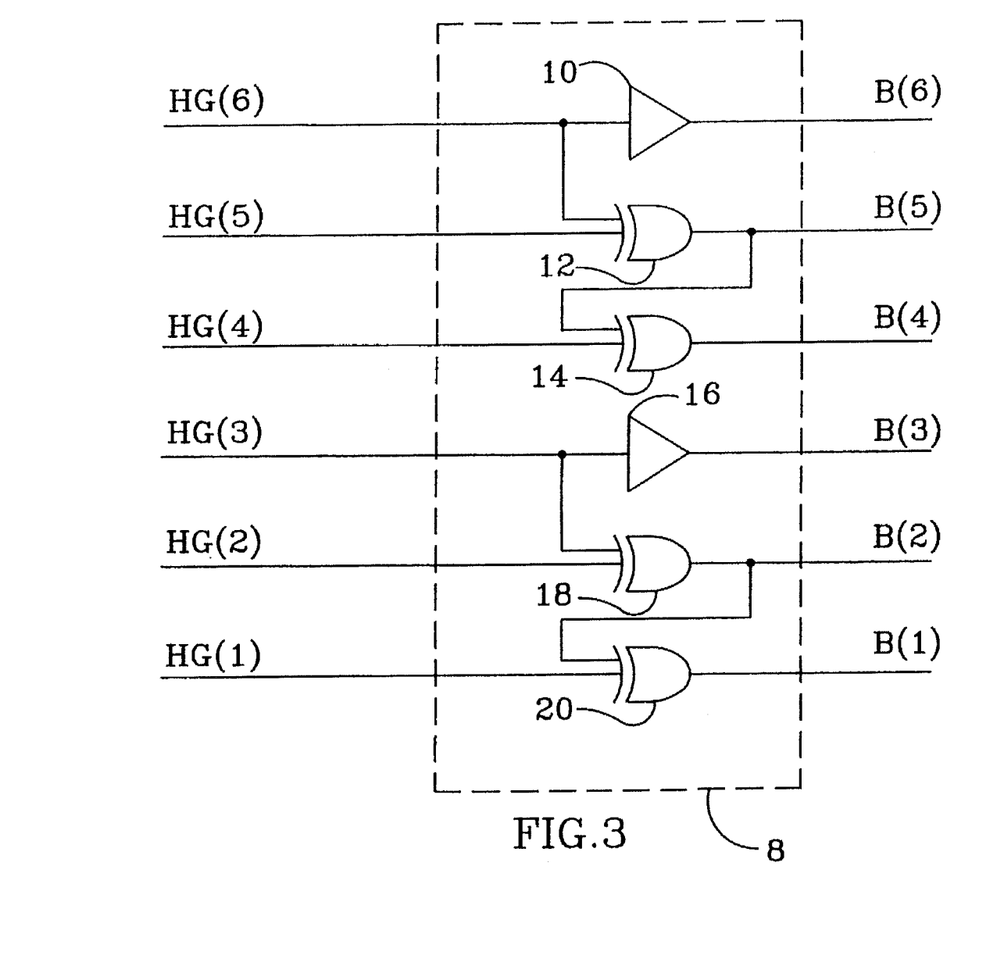
FIG. 3 is a schematic diagram of a Half-Gray-to-binary decoder circuit.

FIG. 3 is a schematic diagram of preferred digital circuitry for the Half-Gray-to-Binary decoder 8. The decoder 8 receives inputs HG(6)-HG(1) and produces outputs B(6)-B(1) according to the decoder 8 algorithm described above. The circuitry includes a first buffer 10 which receives HG(6) and provides an output of B(6) equal to HG(6). A two input first XOR gate 12 receives HG(6) at one of its inputs and HG(5) at its other input to produce B(5). A two input second XOR gate 14 receives the first XOR gate output B(5) at one of its inputs and HG(4) at its other input to produce B(4). A second buffer 16 receives HG(3) and has an output B(3) equal to HG(3). HG(3) is provided as one input to a third two input XOR gate 18 which receives HG(2) at its other input to produce B(2). A fourth two input XOR gate 20 receives HG(1) at one of its inputs and B(2) at its other input to produce B(1).

Figure 4A:
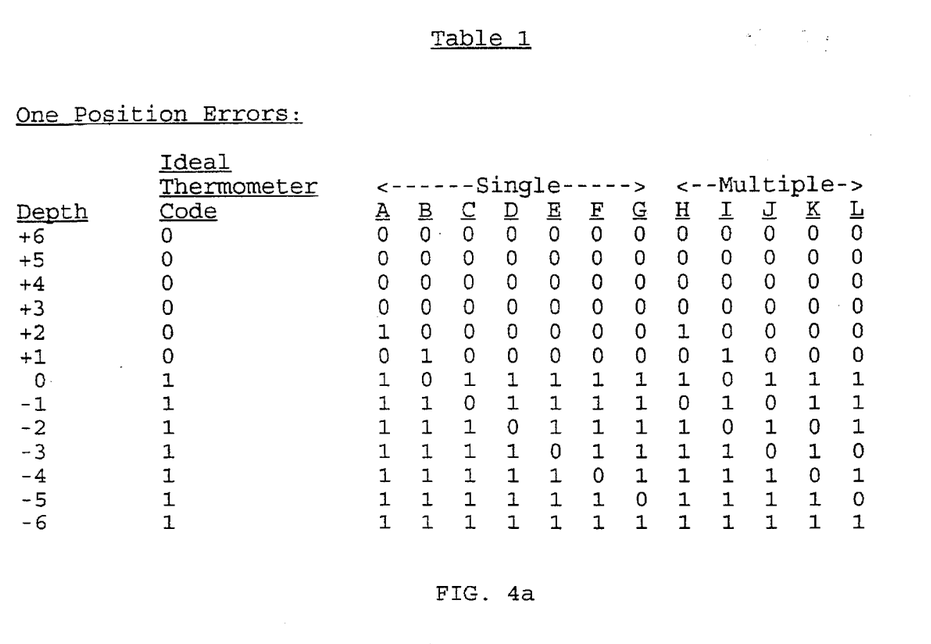
FIGS. 4a, 4b and 4c are three tables of different possible types of thermometer code errors.
Figure 4B:
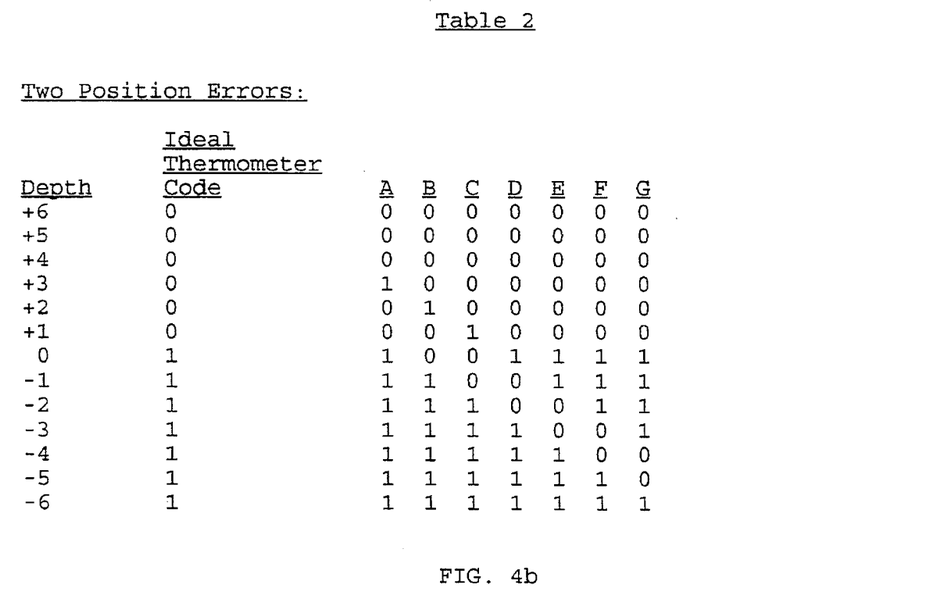
Figure 4C:
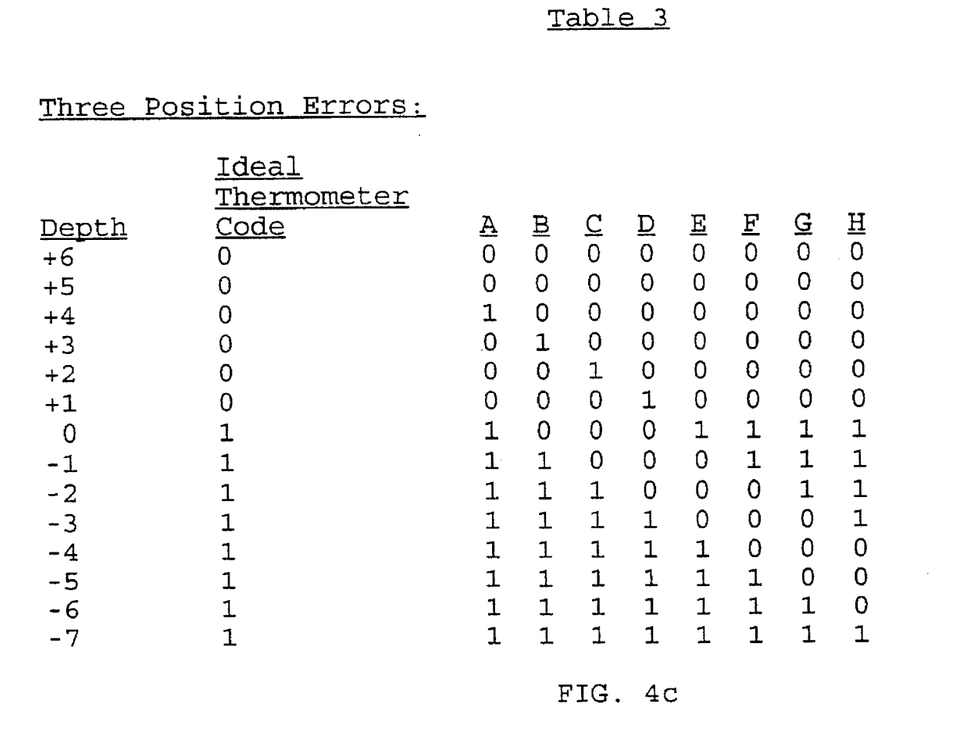
Figure 5:
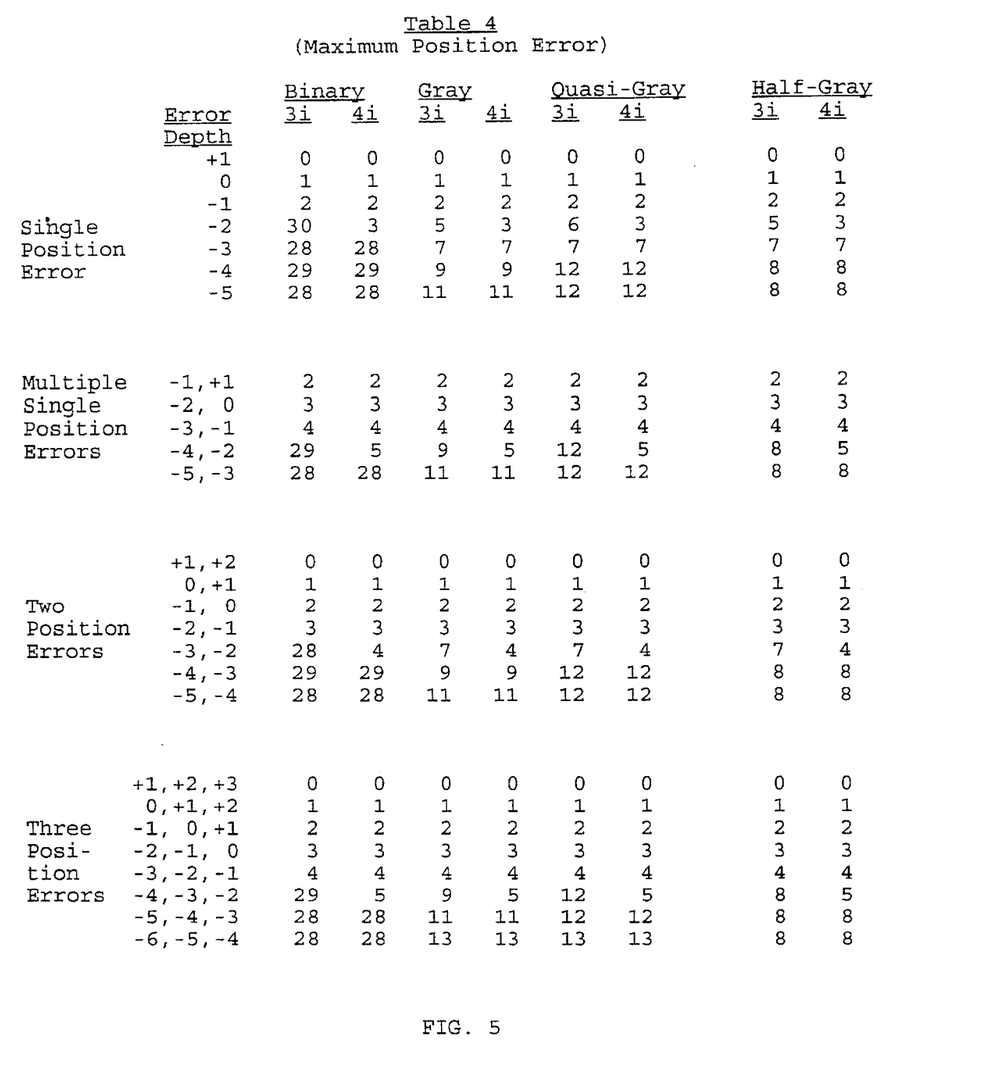
FIG. 5 is a table of simulated test results, showing the maximum ADC output errors for different error reducing encoding methods, including the present invention.
Figure 6:
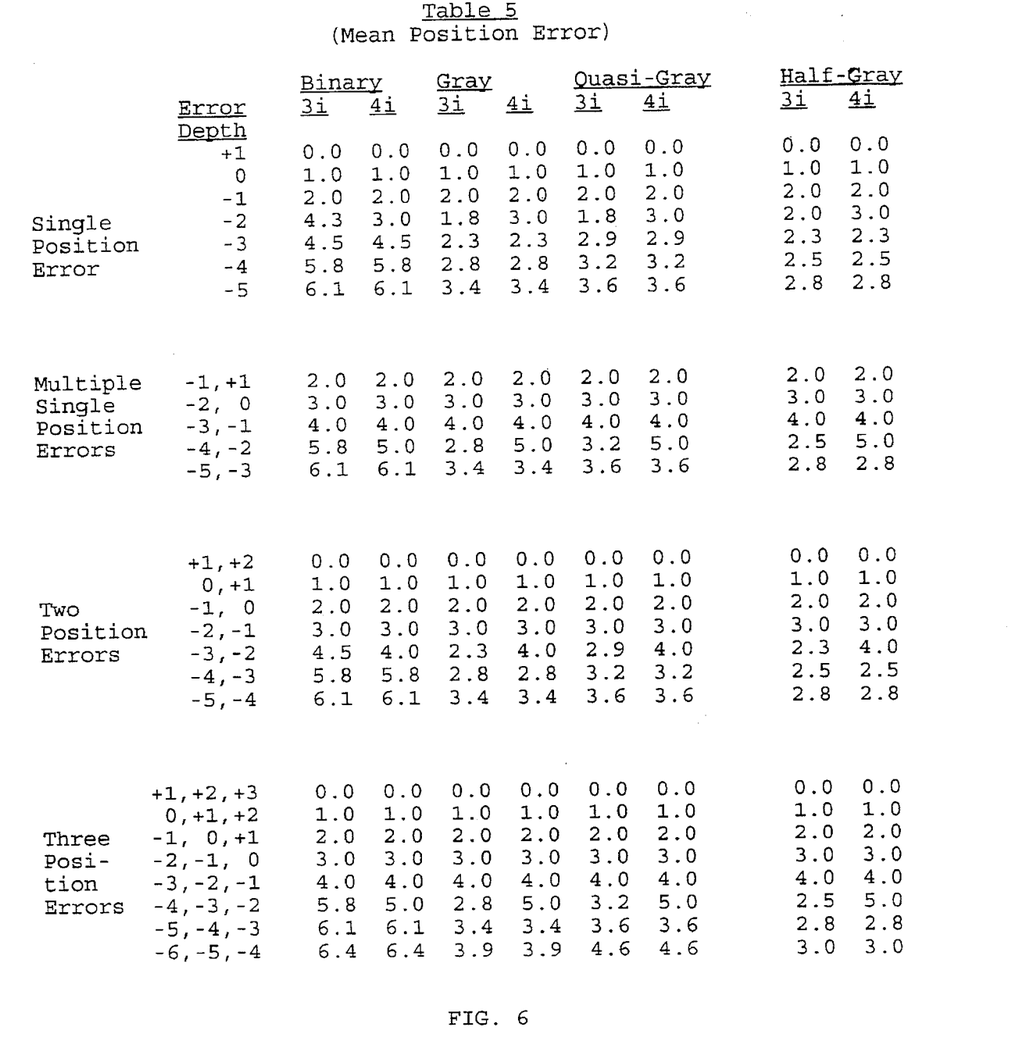
FIG. 6 is a table of the mean values for the errors provided in the table of FIG. 5.

FIGS. 4a, 4b and 4c illustrate the possible errors that can occur in the thermometer code. FIGS. 5 and 6, on the other hand, respectively provide simulated test results of the maximum and the mean ADC output errors for different error reducing encoding methods, including the Half-Gray code of the present invention.

Referring to Table 1 of FIG. 4a, the ideal thermometer code includes a series of binary 0 comparator outputs followed by an uninterrupted series of binary 1 comparator outputs. The depth refers to the position of the comparator outputs relative to one another, with the comparator output at depth +6 being at a greater digital value immediately above the comparator output at depth +5, which in turn is at a greater digital value immediately above the comparator output at depth +4, and so on. Relating this to the comparators shown in FIG. 1a, comparator $C(2^n-1)$'s output is above comparator $C(2^n-2)$'s output, which is above comparator $C(2^n-3)$'s output. The transition point from binary 0 to binary 1 in the ideal thermometer code is designated depth 0.

Columns A–G of Table 1 provide examples of single position errors that can occur in the thermometer code. The error is indicated by a binary 0 among the series of binary is of the thermometer code. For example, errors in the thermometer code occur at depth +1 under column A and at depth 0 under column B. Columns H–L provide examples of multiple single position errors that can occur in the thermometer code. A multiple single position error means that more than one binary 0 is found in the series of binary is of the thermometer code, but each binary 0 is by itself. For example, under column H, two binary 0 errors occur in the thermometer code at depths +1 and −1, while under column I, two binary 0 errors occur at depth 0 and −2.

Referring to FIG. 4a, examples of two-position errors are shown under columns A–G of Table 2 , with two successive binary 0 comparator outputs occurring in the series of binary 1 comparator outputs. For example, under column A, binary 0 errors occur at depths +2 and +1 while under column B, binary 0 errors occur at depths +1 and 0. Referring to FIG. 4c, table 3 shows examples of three-position errors under columns A–H, where three successive binary 0 comparator outputs occur in the string of binary 1 comparator outputs. For example, under column A, binary 0 errors occur at depths +3,+2 and +1 while under column B, binary 0 errors occur at depths +2, +1 and 0.

Table 4 in FIG. 5 provides the maximum 6-bit ADC output errors for different error reducing encoding methods, including the Half-Gray code of the present invention with a Wired-OR ROM encoder. The vertical axis of Table 4 indicates the type of errors that can occur in the thermometer code as described in reference to Tables 1-3 of FIGS. 4a, 4b and 4c. Table 4's horizontal axis, on the other hand, indicates the type of error reducing encoding method that was tested for each thermometer code error. Binary code, Gray code, Quasi-Gray code and Half-Gray encoding methods were tested. The two columns under each code refer to the type of AND function used to decode the thermometer code with 3i and 4i indicating three input and four input AND gates, respectively. The number under each column is the maximum ADC output error, given in number of addresses, in response to an error in the thermometer code. For example, if there is a single position error at depth −1 in the thermometer code of an ADC with a Binary encoder and a decoder having three input AND gates, the ADC output is at a maximum 30 addresses in error from the correct output. Referring to table A of FIGS. 2a and 2b, a 30 address error means that if the expected ADC output is A'30 with the binary code 011110, an errant output of A'60 with the binary code of 111100 is provided for Dout. As another example, if there is a two position thermometer code error at depths −4 and −3 for a three input AND gate Quasi-Gray code encoding method, then the maximum position error is 12 addresses. The corresponding maximum position error for the three input AND gate Half-Gray ADC is 8 addresses.

Table 5 in FIG. 6 is similar to Table 4, but shows the mean rather than the maximum number of addresses in the ADC output error when there is an error in the thermometer code. For all thermometer code errors tested, the Half-Gray code ADC has either an equal or a lower mean output error than the other ADC's tested.

While particular embodiments of the invention have been shown and described, numerous alternate embodiments will occur to those skilled in the art. Accordingly, it is intended that the invention be limited only in terms of the appended claims.

I claim:

1. A digital coding circuit for use in an analog-to-digital converter (ADC) which receives an analog input signal and produces a digital output signal, comprising:

a decoder for producing an output of $2^n$ binary lines, with one active output line representing the amplitude of said ADC's analog input signal, an encoder having $2^n$ input addresses for receiving said decoder output, with each active decoder output line activating a corresponding encoder address to produce an n-bit Half-Gray word at that address, said n-bit Half-Gray word (HG) having the bits:

$HG(i)=B(i)$ for $i=N$ and $i=N/2$ $HG(i)=B(i)$ XOR $B(i+1)$ for $(N/2)<i<N$ and $0<i<(N/2)$ wherein B is an n-bit standard Binary word corresponding to the encoder address activated, N is the total number of bits in said Half-Gray word HG and is an even integer greater than 2, i is an individual bit and is an integer, and XOR is the exclusive-OR logic function, and wherein the Half-Gray words of said encoder's activated addresses are combined to produce a single n-bit Half-Gray word output, reducing the ADC output errors due to multiple active decoder output lines that would otherwise arise in the absence of said encoder.

2. A digital coding circuit as in claim 1, wherein the Half-Gray words of said encoder's activated addresses are combined by their corresponding bits according to the OR function.

3. A digital coding circuit as in claim 1, wherein the Half-Gray words of said encoder's activated addresses are combined by their corresponding bits according to the AND function.

4. A digital coding circuit as in claim 1, further comprising:

a Half-Gray-to-Binary decoder for receiving said n-bit Half-Gray encoder output and converting it to an n-bit standard Binary word output (B) having bits:

$B(i)=HG(i)$ for $i=N$ and $i=N/2$ $B(i)=HG(i)$ XOR $B(i+1)$ for $(N/2)<i<N$ and $0<i<(N/2)$ wherein N is the total number of bits in said Half-Gray-to-Binary decoder output and is an even integer greater than 2, i is an individual bit and is an integer, HG is said n-bit Half-Gray binary word, and XOR is the exclusive-OR function.

5. A digital encoding method for use in an analog-to-digital converter (ADC) which has an analog input signal and a digital output signal, comprising the steps of:

detecting at least one binary zero (0) to binary one (1) transition between ($2^n$-1) binary states in an input signal, wherein one of said binary 0-to-1 transitions represents the amplitude of said ADC analog input signal, generating an output signal having $2^n$ lines, with an active line for each detected binary 0-to-1 transition, converting each active output signal line into an n-bit Half-Gray word (HG), with each Half-Gray word having a corresponding standard Binary word (B) and the bits:

$HG(i)=B(i)$ for $i=N$ and $i=N/2$ $HG(i)=B(i)$ XOR $B(i+1)$ for $(N/2)<i<N$ and $0<i<(N/2)$ wherein N is the total number of bits in said Half-Gray word HG and is an even integer greater than 2, i is an individual bit and is an integer, and XOR is the exclusive-OR logic function, and combining said Half-Gray words to produce a single n-bit Half-Gray word output, said digital encoding method reducing the errors in said ADC output signal due to the detection of more than one binary 0-to-1 transition as compared to the errors that arise in the absence of said digital encoding method.

6. A digital encoding method as in claim 5, wherein said Half-Gray words are combined by their corresponding bits according to the OR function.

7. A digital encoding method as in claim 5, wherein said Half-Gray words are combined by their corresponding bits according to the AND function.

8. A digital encoding method as in claim 5, further comprising the step of:

converting said Half-Gray word into an n-bit Standard Binary word output (B) having bits:

$B(i)=HG(i)$ for $i=N$ and $i=N/2$ $B(i)=HG(i)$ XOR $B(i+1)$ for $(N/2)<i<N$ and $0<i<(N/2)$ wherein N is the total number of bits in said Half-Gray-to-Binary decoder output and is an even integer greater than 2, i is an individual bit and is an integer, HG is said n-bit Half-Gray word and XOR is the exclusive-OR function.

9. An analog-to-digital converter (ADC) for receiving an analog input signal and converting it into its representative digital output signal, comprising:

(2$^n$-1) comparators for providing (2$^n$-1) binary signals having a binary zero (0) to binary one (1) transition which represents the amplitude level of said analog input signal, a decoder for decoding said (2$^n$-1) comparator signals to produce an output of 2$^n$ binary lines, said decoder output having one active output line corresponding to each binary 0-to-1 transition in said comparator signals, an encoder having 2$^n$ input addresses for receiving said decoder output, with each active decoder output line activating a corresponding encoder address to produce an n-bit Half-Gray word at that address, said n-bit Half-Gray word (HG) having the bits:

$HG(i)=B(i)$ for $i=N$ and $i=N/2$ $HG(i)=B(i)$ XOR $B(i+1)$ for $(N/2)<i<N$ and $0<i<(N/2)$ wherein B is an n-bit Standard Binary word corresponding to the encoder address activated, N is the total number of bits in said Half-Gray word HG and is an even integer greater than 2, i is an individual bit and is an integer, and XOR is the exclusive-OR logic function, and wherein the Half-Gray words of said encoder's activated addresses are combined to produce a single n-bit Half-Gray word output, reducing the ADC output errors due to multiple active decoder output lines that would otherwise arise in the absence of said encoder.

10. An ADC as in claim 9, wherein the Half-Gray words of said encoder's activated addresses are combined by their corresponding bits according to the OR function.

11. An ADC as in claim 9, wherein the Half-Gray words of said encoder's activated addresses are combined by their corresponding bits according to the AND function.

12. An ADC as in claim 9, further comprising:

a Half-Gray-to-Binary decoder for receiving said n-bit Half-Gray word encoder output and converting it to an n-bit standard Binary word (B) as the output of said ADC having bits:

$B(i)=HG(i)$ for $i=N$ and $i=N/2$ $B(i)=HG(i)$ XOR $B(i+1)$ for $(N/2)<i<N$ and $0<i<(N/2)$ wherein N is the total number of bits in said Half-Gray-to-Binary decoder output and is an even integer greater than 2, i is an individual bit and is an integer, HG is said n-bit Half-Gray word and XOR is the exclusive-OR function.

13. A read only memory (ROM) for storing Half-Gray words, wherein said ROM is accessed by a 2$^n$ line binary input signal having one active line representing the amplitude of an analog input signal of an analog-to-digital converter (ADC), comprising:

2$^n$ ROM input addresses for receiving said binary input signal, with each active binary input signal line activating a corresponding ROM input address to produce an n-bit Half-Gray word at that input address, said n-bit Half-Gray word (HG) having the bits:

$HG(i)=B(i)$ for $i=N$ and $i=N/2$ $HG(i)=B(i)$ XOR $B(i+1)$ for $(N/2)<i<N$ and $0<i<(N/2)$ wherein B is an n-bit standard Binary word corresponding to said ROM input address activated, N is the total number of bits in said Half-Gray word HG and is an even integer greater than 2, i is an individual bit and is an integer, and XOR is the exclusive-OR logic function, and an n-bit ROM output address for receiving a single n-bit Half-Gray word which is the combination of the Half-Gray word of each of said activated ROM input address, said ROM reducing the ADC output errors due to multiple active binary input signal lines as compared to errors that arise in the absence of said ROM.

14. A ROM as in claim 13, wherein the Half-Gray words of said ROM's activated input addresses are combined by their corresponding bits according to the OR function.

15. A ROM as in claim 13, wherein the Half-Gray words of said ROM's activated input addresses are combined by their corresponding bits according to the AND function.

* * * * *